(12) United States Patent
Kinoshita et al.

(10) Patent No.: US 12,504,273 B2
(45) Date of Patent: Dec. 23, 2025

(54) MEASURING FILM-THICKNESS OF A WORKPIECE IN A SEMICONDUCTOR PROCESSING APPARATUS USING A COMPOSITE SPECTRUM

(71) Applicant: EBARA CORPORATION, Tokyo (JP)

(72) Inventors: Masaki Kinoshita, Tokyo (JP); Yoichi Shiokawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 154 days.

(21) Appl. No.: 18/082,342

(22) Filed: Dec. 15, 2022

(65) Prior Publication Data

US 2023/0204342 A1    Jun. 29, 2023

(30) Foreign Application Priority Data

Dec. 24, 2021    (JP) .................................. 2021-210193

(51) Int. Cl.
| | | |
|---|---|---|
| *G01B 11/06* | (2006.01) | |
| *B24B 37/005* | (2012.01) | |
| *B24B 37/013* | (2012.01) | |
| *B24B 37/20* | (2012.01) | |
| *B24B 49/02* | (2006.01) | |

(Continued)

(52) U.S. Cl.
CPC ........ *G01B 11/0616* (2013.01); *B24B 37/005* (2013.01); *B24B 37/013* (2013.01); *B24B 37/205* (2013.01); *B24B 49/02* (2013.01); *B24B 49/12* (2013.01); *H01L 21/67092* (2013.01);

(Continued)

(58) Field of Classification Search
CPC ............ G01B 11/0616; G01B 11/0625; B24B 37/005; B24B 37/205; B24B 49/02; B24B 49/12; B24B 37/013; B24B 37/107; H01L 21/67253; H01L 22/26; H01L 22/12; H01L 21/67092
See application file for complete search history.

(56) References Cited

U.S. PATENT DOCUMENTS 6,106,662 A *  8/2000  Bibby, Jr. ............... B24B 49/12
                                                      438/692
8,747,189 B2 *  6/2014  David ................... H01L 21/304
                                                      451/4

(Continued)

FOREIGN PATENT DOCUMENTS

JP    2002-359217 A    12/2002
JP    2017-005014 A    1/2017

(Continued)

*Primary Examiner* — Michael P LaPage
(74) *Attorney, Agent, or Firm* — BakerHostetler

(57) ABSTRACT

A film-thickness measuring method capable of substantially extending a wavelength range of a spectrum of reflected light from a workpiece, and accurately measuring a film thickness is disclosed. The film-thickness measuring method includes: pressing a workpiece against a polishing pad, while rotating a polishing table that supports the polishing pad, to polish the workpiece; during the polishing of the workpiece, directing light to the workpiece from a liquid-seal sensor and a transparent-window sensor disposed in the polishing table and receiving reflected light from the workpiece by the liquid-seal sensor and the transparent-window sensor; and determining a film thickness of the workpiece based on a spectrum of the reflected light from the workpiece.

14 Claims, 15 Drawing Sheets

(51) Int. Cl.
  *B24B 49/12*   (2006.01)
  *H01L 21/66*   (2006.01)
  *H01L 21/67*   (2006.01)
(52) U.S. Cl.
  CPC ........ *H01L 21/67253* (2013.01); *H01L 22/26* (2013.01); *H01L 22/12* (2013.01)

(56) References Cited

U.S. PATENT DOCUMENTS

| | | | | |
|---|---|---|---|---|
| 2001/0005265 | A1* | 6/2001 | Kimba | B24B 37/013 250/559.27 |
| 2004/0016895 | A1* | 1/2004 | Amartur | B24B 49/04 250/559.27 |
| 2005/0105103 | A1* | 5/2005 | Schietinger | G01N 21/4738 356/630 |
| 2013/0273814 | A1* | 10/2013 | Kobayashi | B24B 37/013 451/6 |
| 2014/0017824 | A1* | 1/2014 | Iizumi | H01L 21/7684 438/16 |
| 2018/0229346 | A1* | 8/2018 | Kobata | B24B 37/26 |
| 2019/0118331 | A1* | 4/2019 | Takahashi | G01B 11/0633 |
| 2019/0219381 | A1* | 7/2019 | Kimba | B24B 37/34 |
| 2020/0001424 | A1* | 1/2020 | Kimba | B24B 37/013 |
| 2020/0258214 | A1* | 8/2020 | Motamedi | G06T 5/73 |
| 2020/0282512 | A1* | 9/2020 | Kimba | B24B 49/045 |
| 2021/0107112 | A1* | 4/2021 | Kimura | H01L 21/687 |
| 2022/0316863 | A1* | 10/2022 | Chauhan | G01B 11/0633 |
| 2022/0388112 | A1* | 12/2022 | Motamedi | H01L 22/26 |

FOREIGN PATENT DOCUMENTS

| | | |
|---|---|---|
| JP | 2017-220683 A | 12/2017 |
| KR | 2019-0126471 A | 11/2019 |

\* cited by examiner

MEASURING FILM-THICKNESS OF A WORKPIECE IN A SEMICONDUCTOR PROCESSING APPARATUS USING A COMPOSITE SPECTRUM

CROSS REFERENCE TO RELATED APPLICATION

This document claims priority to Japanese Patent Application No. 2021-210193 filed Dec. 24, 2021, the entire contents of which are hereby incorporated by reference.

BACKGROUND

In a manufacturing process of a semiconductor device, various materials are repeatedly formed in film shapes on a silicon wafer to form a multilayer structure. In order to form such multilayer structure, a technique of planarizing a surface of an uppermost layer of the multilayer structure is important. Chemical mechanical polishing (CMP) is used as one of such planarizing techniques.

The chemical mechanical polishing (CMP) is performed by a polishing apparatus. This type of polishing apparatus generally includes a polishing table configured to support a polishing pad, a polishing head configured to hold a wafer having a film, and a polishing-liquid supply nozzle configured to supply a polishing liquid (for example, slurry) onto the polishing pad. The polishing apparatus is configured such that the polishing liquid is supplied onto the polishing pad from the polishing-liquid supply nozzle while the polishing head and the polishing table are rotating. The polishing head presses a surface of the wafer against the polishing pad to polish the film forming the surface of the wafer in the presence of the polishing liquid between the wafer and the polishing pad.

In order to measure a thickness of a non-metal film, such as a dielectric film or a silicon layer, (hereinafter, simply referred to as a film thickness), the polishing apparatus generally includes an optical film-thickness measuring device. This optical film-thickness measuring device is configured to direct light, emitted by a light source, to the surface of the wafer through a sensor head, receive reflected light from the wafer by the sensor head, and analyze a spectrum of the reflected light to determine a film thickness of the wafer. The polishing apparatus can terminate polishing of the wafer or change polishing conditions of the wafer based on the determined film thickness.

During the polishing of the wafer, the polishing liquid and polishing debris are present on the polishing pad. When the polishing liquid or the polishing debris adheres to the sensor head, an intensity of the light directed to the wafer and an intensity of the reflected light from the wafer decrease, and as a result, the film thickness cannot be measured accurately. Thus, there is a technique of forming a flow of water between the sensor head and the wafer or disposing a transparent window between the sensor head and the wafer. These techniques prevent the polishing liquid and the polishing debris from contacting the sensor head, and a good optical path is ensured.

However, the water has a wavelength band that absorbs light. The transparent window made of resin also has a wavelength band in which light is difficult to pass. Therefore, a wavelength range for producing the spectrum of the reflected light for measuring the film thickness is limited, and as a result, film-thickness measurement may not be accurate for some types of films.

SUMMARY

Therefore, there are provided a film-thickness measuring method and a film-thickness measuring apparatus capable of substantially extending a wavelength range of a spectrum of reflected light from a workpiece, and capable of accurately measuring a film thickness.

Embodiments, which will be described below, relate to a technique of measuring a film thickness of a workpiece, such as a wafer, a substrate, or a panel, for use in manufacturing of semiconductor devices, while polishing the workpiece, and more particularly to a technique of determining the film thickness of the workpiece based on optical information contained in reflected light from the workpiece.

In an embodiment, there is provided a film-thickness measuring method comprising: pressing a workpiece against a polishing pad, while rotating a polishing table that supports the polishing pad, to polish the workpiece; during polishing of the workpiece, directing light to the workpiece from a liquid-seal sensor and a transparent-window sensor disposed in the polishing table and receiving reflected light from the workpiece by the liquid-seal sensor and the transparent-window sensor; and determining a film thickness of the workpiece based on a spectrum of the reflected light from the workpiece, wherein the liquid-seal sensor has a liquid flow passage through which liquid flows, and a first optical sensor head disposed in the liquid flow passage, and the transparent-window sensor has a second optical sensor head, and a transparent window arranged above the second optical sensor head.

In an embodiment, the liquid-seal sensor and the transparent-window sensor are arranged on a circumference having the same center as a rotation center of the polishing table.

In an embodiment, the film thickness of the workpiece is determined in a first polishing period based on a spectrum of the reflected light from the workpiece transmitted from one of the liquid-seal sensor and the transparent-window sensor, and the film thickness of the workpiece is determined in a second polishing period based on a spectrum of the reflected light from the workpiece transmitted from other of the liquid-seal sensor and the transparent-window sensor.

In an embodiment, the film-thickness measuring method further comprises producing a composite spectrum by combining a spectrum of the reflected light from the workpiece transmitted from the liquid-seal sensor and a spectrum of the reflected light from the workpiece transmitted from the transparent-window sensor, wherein determining the film thickness of the workpiece comprises determining the film thickness of the workpiece based on the composite spectrum.

In an embodiment, a wavelength range of a spectrum of the reflected light transmitted from the liquid-seal sensor is different from a wavelength range of a spectrum of the reflected light transmitted from the transparent-window sensor.

In an embodiment, the liquid-seal sensor and the transparent-window sensor comprise a plurality of liquid-seal sensors and a plurality of transparent-window sensors.

In an embodiment, the liquid-seal sensor and the transparent-window sensor are arranged on each of a plurality of concentric circles having the same center as a rotation center of the polishing table.

In an embodiment, there is provided a film-thickness measuring apparatus comprises: a liquid-seal sensor and a transparent-window sensor disposed in a rotatable polishing table configured to support a polishing pad for polishing a workpiece; and a spectrum processing device configured to determine a film thickness of the workpiece based on a spectrum of reflected light from the workpiece transmitted from the liquid-seal sensor and the transparent-window sensor, wherein the liquid-seal sensor has a liquid flow passage configured to pass liquid therethrough, and a first optical sensor head disposed in the liquid flow passage, and the transparent-window sensor has a second optical sensor head, and a transparent window arranged above the second optical sensor head.

In an embodiment, the liquid-seal sensor and the transparent-window sensor are arranged on a circumference having the same center as a rotation center of the polishing table.

In an embodiment, the spectrum processing device is configured to: determine the film thickness of the workpiece in a first polishing period based on a spectrum of the reflected light from the workpiece transmitted from one of the liquid-seal sensor and the transparent-window sensor; and determine the film thickness of the workpiece in a second polishing period based on a spectrum of the reflected light from the workpiece transmitted from the other of the liquid-seal sensor and the transparent-window sensor.

In an embodiment, the spectrum processing device is configured to: produce a composite spectrum by combining a spectrum of the reflected light from the workpiece transmitted from the liquid-seal sensor and a spectrum of the reflected light from the workpiece transmitted from the transparent-window sensor; and determine the film thickness of the workpiece based on the composite spectrum.

In an embodiment, the film-thickness measuring apparatus a further comprises: a first spectrometer coupled to the liquid-seal sensor; and a second spectrometer coupled to the transparent-window sensor, wherein the first spectrometer is configured to measure intensities of the reflected light from the workpiece in a first wavelength range to generate first intensity measurement data, the second spectrometer is configured to measure intensities of the reflected light from the workpiece in a second wavelength range to generate second intensity measurement data, and the first wavelength range is different from the second wavelength range.

In an embodiment, the liquid-seal sensor and the transparent-window sensor comprise a plurality of liquid-seal sensors and a plurality of transparent-window sensors.

In an embodiment, the liquid-seal sensor and the transparent-window sensor are arranged on each of a plurality of concentric circles having the same center as a rotation center of the polishing table.

The liquid-seal sensor and the transparent-window sensor emit and receive light through different media, which are the liquid and the transparent window. Spectra of the reflected light obtained through these different types of sensors indicate accurate intensity of the reflected light in different wavelength ranges. According to the above-described embodiments, the spectra of reflected light obtained through both the liquid-seal sensor and the transparent-window sensor are used during the polishing of the workpiece, so that the wavelength range of the reflected light for use in measuring of the film thickness is substantially extended. As a result, the thickness of various types of films can be measured accurately.

DESCRIPTION OF EMBODIMENTS

Embodiments will be described below with reference to the drawings.

Figure 1:
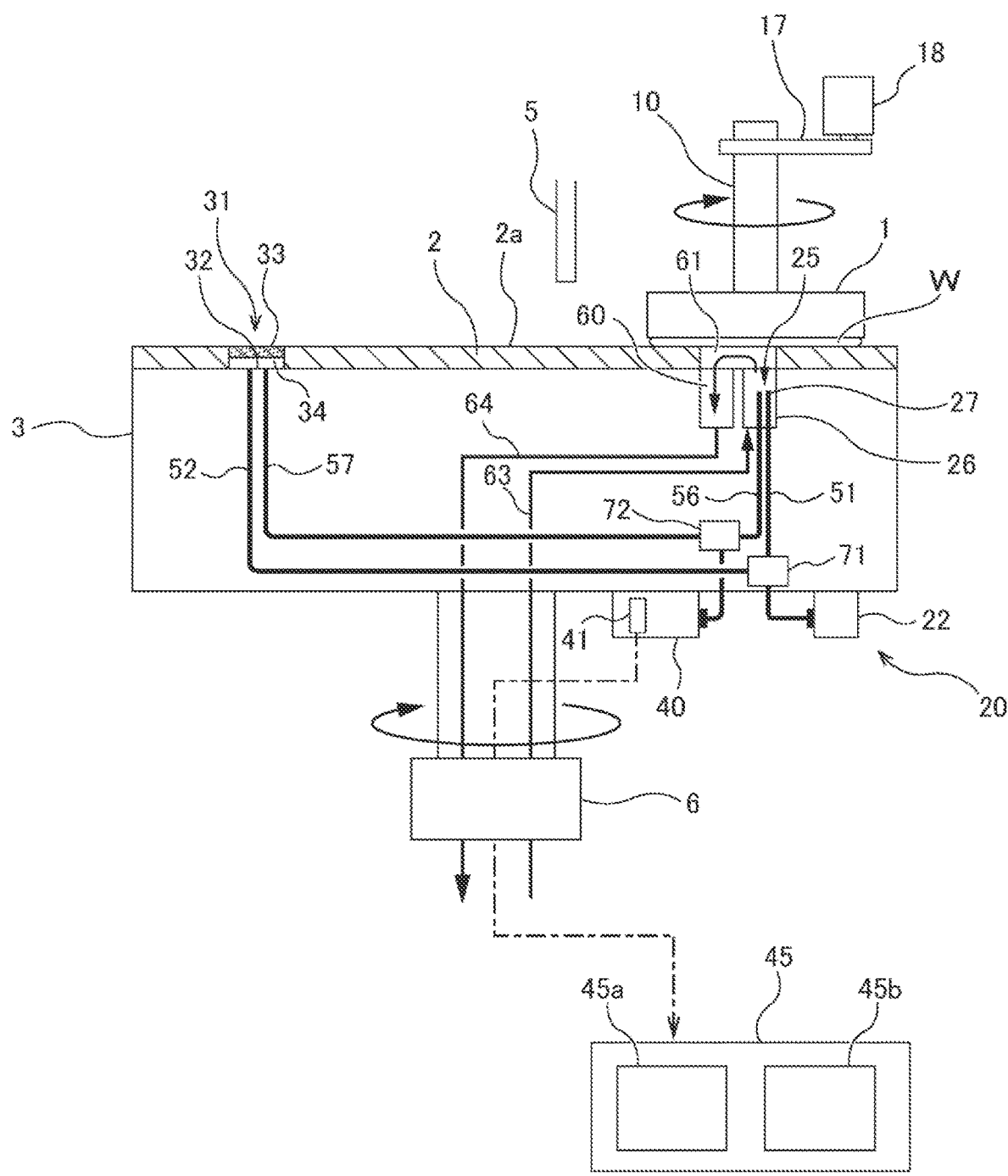
FIG. 1 is a schematic diagram showing an embodiment of a polishing apparatus.

FIG. 1 is schematic view showing an embodiment of a polishing apparatus. As shown in FIG. 1, the polishing apparatus includes a polishing table 3 configured to support a polishing pad 2, a polishing head 1 configured to press a workpiece W, such as a wafer, a substrate, a panel, etc., for use in manufacturing of semiconductor devices against the polishing pad 2, a table motor 6 configured to rotate the polishing table 3, and a polishing-liquid supply nozzle 5 configured to supply polishing liquid (e.g., slurry) onto the polishing pad 2. The polishing pad 2 has an upper surface constituting a polishing surface 2a for polishing the workpiece W.

The polishing head 1 is coupled to a head shaft 10, which is coupled to a polishing-head motor 18 via a coupling device 17. Although a structure of the coupling device 17 is not particularly limited, the coupling device 17 may be constituted of a combination of pulleys and a belt, a combination of gears, a combination of sprockets and a chain, or the like. The polishing-head motor 18 is configured to rotate the polishing head 1 together with the head shaft 10 in a direction indicated by an arrow. The polishing table 3 is coupled to the table motor 6, which is configured to rotate the polishing table 3 and the polishing pad 2 in a direction indicated by an arrow.

Polishing of the workpiece W is performed as follows. The polishing-liquid supply nozzle 5 supplies the polishing liquid onto the polishing surface 2a of the polishing pad 2 on the polishing table 3, while the polishing table 3 and the polishing head 1 are rotated in directions indicated by the arrows in FIG. 1. While the workpiece W is being rotated by the polishing head 1, the workpiece W is pressed by the polishing head 1 against the polishing surface 2a of the polishing pad 2 in the presence of the polishing liquid on the polishing pad 2. A surface of the workpiece W is polished by a chemical action of the polishing liquid and mechanical action(s) of abrasive grains contained in the polishing liquid and/or the polishing pad 2.

The polishing apparatus includes a film-thickness measuring apparatus 20 configured to measure a film thickness of the workpiece W. The film-thickness measuring apparatus 20 includes a light source 22 configured to emit light, a liquid-seal sensor 25 and a transparent-window sensor 31 each configured to irradiate a workpiece W with the light from the light source 22 and receive reflected light from the workpiece W, a spectrometer 40 coupled to the liquid-seal sensor 25 and the transparent-window sensor 31, and a spectrum processing device 45 configured to determine the film thickness of the workpiece W based on intensity measurement data of the reflected light from the workpiece W. The liquid-seal sensor 25 and the transparent-window sensor 31 are attached to the polishing table 3 and rotate together with the polishing table 3.

Each time the polishing table 3 makes one rotation, the light emitted by the light source 22 is transmitted to the liquid-seal sensor 25 and the transparent-window sensor 31 alternately, and directed to the surface of the workpiece W from the liquid-seal sensor 25 and the transparent-window sensor 31 alternately. The light reflects off the surface of the workpiece W. The reflected light from the surface of the workpiece W is received by the liquid-seal sensor 25 and the transparent-window sensor 31 alternately, and the reflected light is transmitted to the spectrometer 40. The spectrometer 40 decomposes the reflected light according to wavelength over a predetermined wavelength range and measures an intensity of the reflected light at each of wavelengths to generate intensity measurement data of the reflected light. The intensity measurement data of the reflected light is transmitted from the spectrometer 40 to the spectrum processing device 45.

The spectrum processing device 45 is configured to produce a spectrum of the reflected light from the intensity measurement data of the reflected light. This spectrum of the reflected light is expressed as a line graph (i.e., a spectral waveform) indicating a relationship between the wavelength and the intensity of the reflected light. The intensity of the reflected light can also be represented by a relative value, such as a reflectance or a relative reflectance.

The spectrum processing device 45 includes a memory 45a storing programs therein, and an arithmetic device 45b configured to perform arithmetic operations according to instructions contained in the programs. The spectrum processing device 45 is composed of at least one computer. The memory 45a includes a main memory, such as a random-access memory (RAM), and an auxiliary memory, such as a hard disk drive (HDD) or a solid state drive (SSD). Examples of the arithmetic device 45b include a CPU (central processing unit) and a GPU (graphic processing unit). However, the specific configuration of the spectrum processing device 45 is not limited to these examples.

Figure 2:
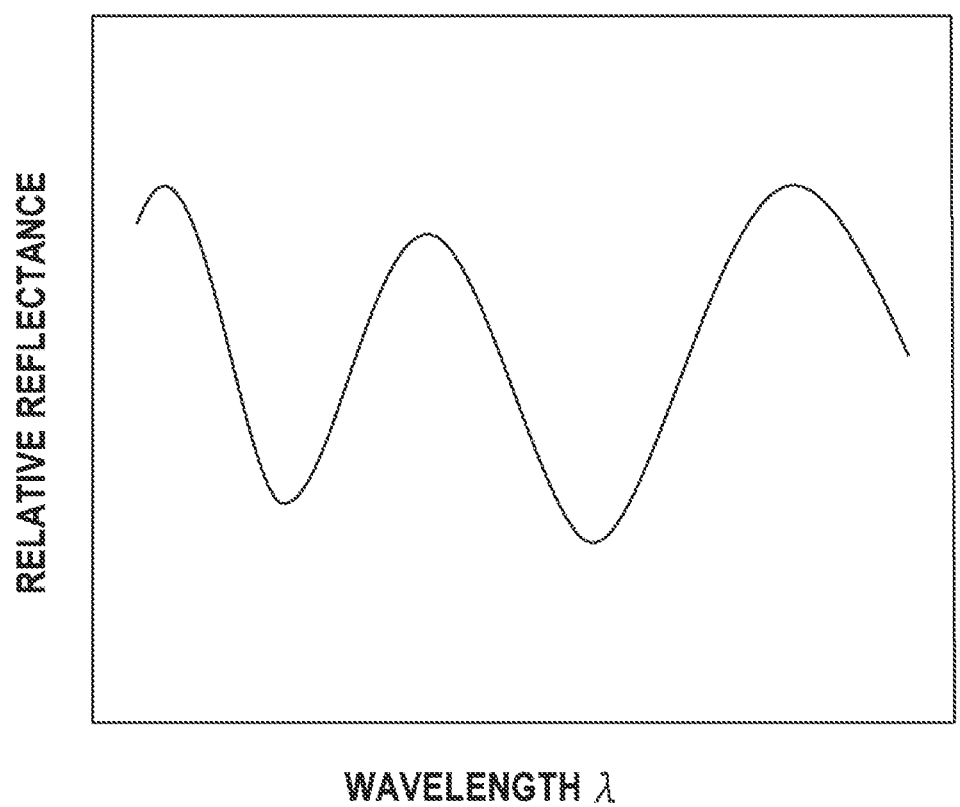
FIG. 2 is a diagram showing an example of a spectrum created by a spectrum processing device.

FIG. 2 is a diagram showing an example of a spectrum created by the spectrum processing device 45. The spectrum is represented as a line graph (i.e., a spectral waveform) showing the relationship between the wavelength and intensity of light. In FIG. 2, horizontal axis represents wavelength of the light reflected from the workpiece W, and vertical axis represents relative reflectance derived from the intensity of the reflected light. The relative reflectance is an index value that represents the intensity of the reflected light. Specifically, the relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

In the example shown in FIG. 2, the spectrum of the reflected light is a spectral waveform showing the relationship between the relative reflectance and the wavelength of the reflected light. The spectrum of the reflected light may be a spectral waveform showing a relationship between the intensity itself of the reflected light and the wavelength of the reflected light.

During one rotation of the polishing table 3, the spectrum processing device 45 receives the intensity measurement data of the reflected light from the workpiece W, and produces a spectrum of the reflected light from the intensity measurement data. The spectrum processing device 45 is configured to determine the film thickness of the workpiece W from the spectrum of the reflected light. Known technique is used for a method of determining the film thickness of the workpiece W based on the spectrum. For example, the spectrum processing device 45 determines a reference spectrum in a reference spectrum library that is closest in shape to the spectrum of the reflected light, and determines a film thickness associated with the determined reference spectrum. In another example, the spectrum processing device 45 performs a Fourier transform on the spectrum of the reflected light, and determines a film thickness from a frequency spectrum obtained.

Details of the film-thickness measuring apparatus 20 will be described with reference to FIG. 1. The spectrometer 40 includes a photodetector 41. In one embodiment, the photodetector 41 is constituted by a photodiode, CCD, CMOS, or the like. The liquid-seal sensor 25 and the transparent-window sensor 31 are optically coupled to the light source 22 and the photodetector 41. The photodetector 41 is electrically coupled to the spectrum processing device 45.

The film-thickness measuring apparatus 20 includes a first light-emitting optical fiber cable 51 and a second light-emitting optical fiber cable 52 each configured to direct the light, emitted by the light source 22, to the surface of the workpiece W, and a first light-receiving optical fiber cable 56 and a second light-receiving optical fiber cable 57 each configured to receive the reflected light from the workpiece W and transmit the reflected light to the spectrometer 40. An end of the first light-emitting optical fiber cable 51 and an end of the first light-receiving optical fiber cable 56 are located in the polishing table 3. Similarly, an end of the second light-emitting optical fiber cable 52 and an end of the second light-receiving optical fiber cable 57 are located in the polishing table 3.

The liquid-seal sensor 25 includes a liquid flow passage 26 through which pure water as a rinsing liquid flows, and a first optical sensor head 27 disposed in the liquid flow passage 26. The first optical sensor head 27 includes the end of the first light-emitting optical fiber cable 51 and the end of the first light-receiving optical fiber cable 56. The first optical sensor head 27 emits the light to the workpiece W through the pure water flowing in the liquid flow passage 26, and receives the reflected light from the workpiece W that has passed through the pure water flowing in the liquid flow passage 26.

The liquid flow passage 26 is provided in the polishing table 3 and opens in an upper surface of the polishing table 3. The polishing table 3 has a drain hole 60 that opens in the upper surface of the polishing table 3. The drain hole 60 is adjacent to the liquid flow passage 26. The polishing pad 2 has a first through-hole 61 formed at a position corresponding to the liquid flow passage 26 and the drain hole 60. The liquid flow passage 26 and the drain hole 60 communicate with the first through-hole 61, and the first through-hole 61 opens in the polishing surface 2a. The liquid flow passage 26 is coupled to a liquid supply line 63, and the drain hole 60 is coupled to a drain line 64. The liquid-seal sensor 25 is located under the first through-hole 61.

During the polishing of the workpiece W, the pure water is supplied as a transparent rinsing liquid to the liquid flow passage 26 through the liquid supply line 63, and is further supplied to the first through-hole 61 through the liquid flow passage 26. Flow of the pure water is formed between the surface of the workpiece W (surface to be polished) and the first optical sensor head 27. The pure water flows into the drain hole 60, and is discharged through the drain line 64. The pure water flowing through the liquid flow passage 26 and the first through-hole 61 prevents the polishing liquid and polishing debris from contacting the first optical sensor head 27, thereby securing an optical path.

The light source 22 transmits the light to the liquid-seal sensor 25 through the first light-emitting optical fiber cable 51, and the liquid-seal sensor 25 emits the light to the workpiece W through the pure water in the liquid flow passage 26 and the first through-hole 61. The reflected light from the workpiece W passes through the pure water, is received by the liquid-seal sensor 25, and is transmitted to the spectrometer 40 through the first light-receiving optical fiber cable 56. The spectrometer 40 decomposes the reflected light according to its wavelength and measures the intensity of the reflected light at each of the wavelengths over the predetermined wavelength range. The spectrometer 40 transmits the intensity measurement data of the reflected light to the spectrum processing device 45. The spectrum processing device 45 produces the spectrum of the reflected light from the intensity measurement data of the reflected light and determines the film thickness of the workpiece W based on the spectrum of the reflected light.

The transparent-window sensor 31 includes a second optical sensor head 32 and a transparent window 33 arranged above the second optical sensor head 32. The second optical sensor head 32 includes the end of the second light-emitting optical fiber cable 52 and the end of the second light-receiving optical fiber cable 57. The second optical sensor head 32 is disposed in the polishing table 3, and the transparent window 33 is arranged in a second through-hole 34 formed in the polishing pad 2. The transparent window 33 completely closes the second through-hole 34 of the polishing pad 2, thereby preventing the polishing liquid and the polishing debris from contacting the second optical sensor head 32.

The second optical sensor head 32 emits the light to the workpiece W through the transparent window 33, and receives the reflected light from the workpiece W that has passed through the transparent window 33. The transparent window 33 is made of a material that allows light to pass therethrough. Although the material of the transparent window 33 is not particularly limited, for example, the transparent window 33 is made of transparent resin.

The light source 22 transmits the light to the transparent-window sensor 31 through the second light-emitting optical fiber cable 52, and the transparent-window sensor 31 emits the light to the workpiece W through the transparent window 33. The reflected light from the workpiece W is received by the transparent-window sensor 31 and is transmitted to the spectrometer 40 through the second light-receiving optical fiber cable 57. The spectrometer 40 decomposes the reflected light according to its wavelength and measures the intensity of the reflected light at each of the wavelengths over the predetermined wavelength range. The spectrometer 40 transmits the intensity measurement data of the reflected light to the spectrum processing device 45. The spectrum processing device 45 produces the spectrum of the reflected light from the intensity measurement data of the reflected light and determines the film thickness of the workpiece W based on the spectrum of the reflected light.

The first light-emitting optical fiber cable 51 and the second light-emitting optical fiber cable 52 are coupled to a first optical-path switching device 71, and are coupled to the light source 22 via the first optical-path switching device 71. The first optical-path switching device 71 has an optical switch, a shutter, or the like, and is configured to optically couple the light source 22 to either the first light-emitting optical fiber cable 51 or the second light-emitting optical fiber cable 52. Therefore, the light emitted by the light source 22 is transmitted to either the liquid-seal sensor 25 or the transparent-window sensor 31 via the first optical-path switching device 71.

The first light-receiving optical fiber cable 56 and the second light-receiving optical fiber cable 57 are coupled to a second optical-path switching device 72, and are coupled to the spectrometer 40 via the second optical-path switching device 72. The second optical-path switching device 72 has an optical switch, a shutter, or the like, and is configured to optically couple the spectrometer 40 to either the first light-receiving optical fiber cable 56 or the second light-receiving optical fiber cable 57. Therefore, the spectrometer 40 is optically coupled to either the liquid-seal sensor 25 or the transparent-window sensor 31 via the second optical-path switching device 72.

The first optical-path switching device 71 and the second optical-path switching device 72 operate each time the polishing table 3 makes one rotation, and optically couple the light source 22 and the spectrometer 40 to either the liquid-seal sensor 25 or the transparent-window sensor 31. More specifically, when the liquid-seal sensor 25 is located under the workpiece W retained by the polishing head 1, the first optical-path switching device 71 and the second optical-path switching device 72 couple the light source 22 and the spectrometer 40 to the liquid-seal sensor 25. When the transparent-window sensor 31 is located under the workpiece W retained by the polishing head 1, the first optical-path switching device 71 and the second optical-path switching device 72 couple the light source 22 and the spectrometer 40 to the transparent-window sensor 31. In this way, the common light source 22 can transmit the light to the liquid-seal sensor 25 and the transparent-window sensor 31 alternately, and the common spectrometer 40 can receive the reflected light from the workpiece W through the liquid-seal sensor 25 and the transparent-window sensor 31 alternately.

Figure 3:
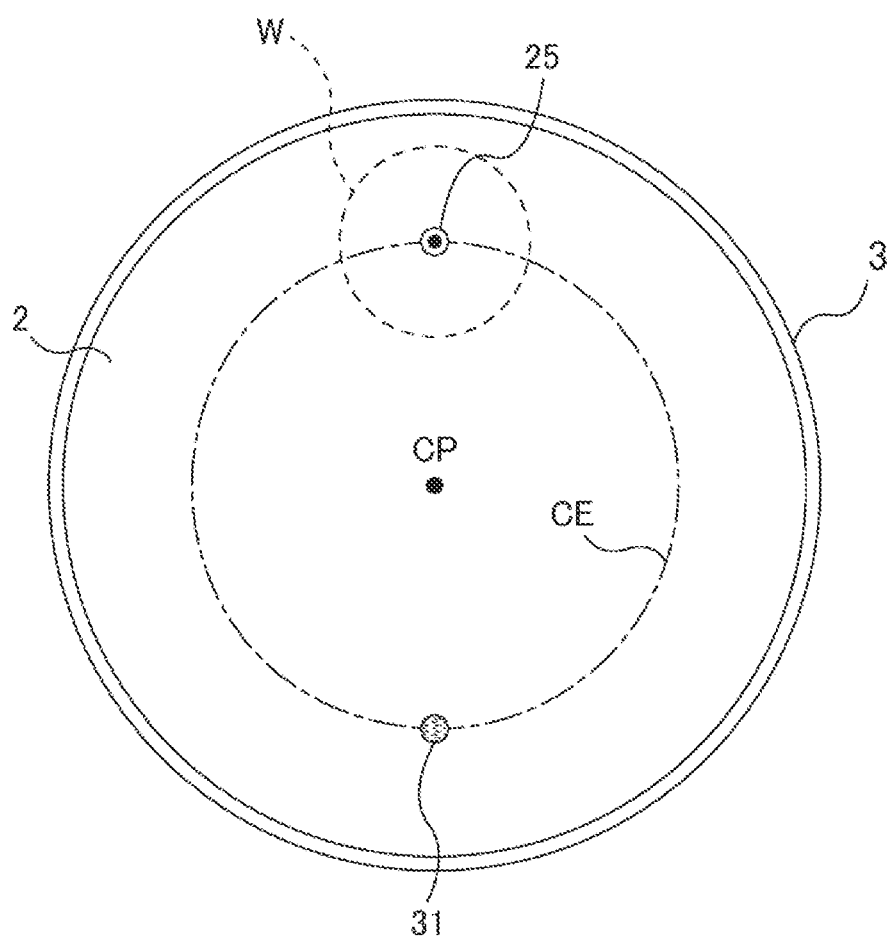
FIG. 3 is a top view showing an arrangement of a liquid-seal sensor and a transparent-window sensor.

FIG. 3 is a top view showing an arrangement of the liquid-seal sensor 25 and the transparent-window sensor 31. As shown in FIG. 3, the liquid-seal sensor 25 and the transparent-window sensor 31 are arranged on a circumference CE having the same center as a rotation center CP of the polishing table 3. The liquid-seal sensor 25 and the transparent-window sensor 31 are arranged around the rotation center CP of the polishing table 3 at regular intervals. The liquid-seal sensor 25 and the transparent-window sensor 31 rotate together with the polishing table 3 in the same path. In the example shown in FIG. 3, the liquid-seal sensor 25 and the transparent-window sensor 31 are arranged so as to alternately pass through the center of the workpiece W each time the polishing table 3 makes one rotation. The circumference CE is an imaginary circle that represents a movement path of the liquid-seal sensor 25 and the transparent-window sensor 31. In one embodiment, the liquid-seal sensor 25 and the transparent-window sensor 31 may be arranged on different circumferences having the same center as the rotation center CP of the polishing table 3.

The liquid-seal sensor 25 and the transparent-window sensor 31 direct and receive the light through the pure water and the transparent window 33, respectively, which are different media. The spectra of the reflected light obtained through these different types of sensors 25 and 31 represent accurate intensity of the reflected light in different wavelength ranges. According to this embodiment, the spectra of the reflected light obtained through both the liquid-seal sensor 25 and the transparent-window sensor 31 are used during the polishing of the workpiece W, so that the wavelength range of the reflected light for use in measuring of the film thickness is substantially extended. As a result, the thickness of various types of films can be measured accurately.

The spectrum processing device 45 determines the film thickness of the workpiece W based on the spectra of the reflected light of the workpiece W alternately transmitted from the liquid-seal sensor 25 and the transparent-window sensor 31. In the embodiment shown in FIG. 3, during one rotation of the polishing table 3, the spectrum processing device 45 determines a film thickness of the workpiece W based on a spectrum of the reflected light transmitted from the liquid-seal sensor 25, and determines a film thickness of the workpiece W based on a spectrum of the reflected light transmitted from the transparent-window sensor 31.

Depending on types of films on the workpiece W and/or surface structures of the workpiece W, in beginning of the polishing of the workpiece W, a shape of the spectrum in a short-wavelength range may not change significantly, while a shape of the spectrum in a long-wavelength range may change significantly. In contrast, in a later stage of the polishing of the workpiece W, the shape of the spectrum in the long-wavelength range may not change significantly, while the shape of the spectrum in the short-wavelength range may change significantly. Since the film thickness of the workpiece W decreases with polishing time, the spectrum with no change in its shape may not accurately reflect the change in the film thickness. Pure water has a property that allows light in a short-wavelength band to pass therethrough but absorbs light in a long-wavelength band. In contrast, the transparent window 33 made of resin has a property that allows light in a long wavelength band to pass therethrough but hardly allows light in a short wavelength band to pass therethrough.

Therefore, in one embodiment, the spectrum processing device 45 is configured to determine the film thickness of the workpiece W based on the spectrum of the reflected light from the workpiece W transmitted from the transparent-window sensor 31 in a first polishing period during the polishing of the workpiece W, and the spectrum processing device 45 is configured to determine the film thickness of the workpiece W based on the spectrum of the reflected light from the workpiece W transmitted from the liquid-seal sensor 25 in a second polishing period during the polishing of the workpiece W. Each of the first polishing period and the second polishing period is a different preset polishing period. For example, the first polishing period is a polishing period from a polishing initial point to a predetermined polishing intermediate point, and the second polishing period is a polishing period from the predetermined polishing intermediate point to a polishing end point, but is not limited to this example. According to such operations, the spectrum processing device 45 can determine the film thickness of the workpiece W based on the spectra that correctly reflect the change in the film thickness of the workpiece W throughout the polishing of the workpiece W.

Depending on types of films on the workpiece W and/or the surface structures of the workpiece W, in the beginning of the polishing of the workpiece W, a shape of the spectrum in the long-wavelength range may not change significantly, while a shape of the spectrum in the short-wavelength range may change significantly. Therefore, in one embodiment, the spectrum processing device 45 may determine the film thickness of the workpiece W based on the spectrum of the reflected light from the workpiece W transmitted from the liquid-seal sensor 25 in the first polishing period during polishing of the workpiece W, and the spectrum processing device 45 may determine the film thickness of the workpiece W based on the spectrum of the reflected light from the workpiece W transmitted from the transparent-window sensor 31 in the second polishing period during polishing of the workpiece W.

In one embodiment, a plurality of polishing periods, which include at least one polishing period in addition to the first polishing period and the second polishing period, may be provided. During the polishing of the workpiece W, the spectrum processing device 45 may determine the film thickness of the workpiece W based on the spectrum of the reflected light from the workpiece W transmitted from either the liquid-seal sensor 25 or the transparent-window sensor 31 in each polishing period, while alternately switching between the liquid-seal sensor 25 and the transparent-window sensor 31.

In one embodiment, the spectrum processing device 45 may be configured to produce a composite spectrum by combining the spectrum of the reflected light from the workpiece W transmitted from the liquid-seal sensor 25 and the spectrum of the reflected light from the workpiece W transmitted from the transparent-window sensor 31, and determine the film thickness of the workpiece W based on the composite spectrum. Hereinafter, this embodiment will be described below with reference to FIGS. 4 and 5.

Figure 4:
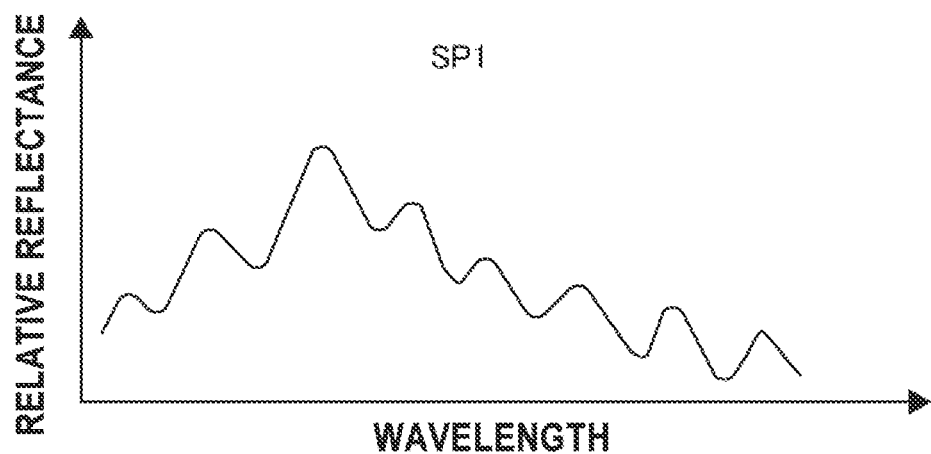
FIG. 4 is a diagram showing a spectrum of reflected light from a workpiece transmitted from the liquid-seal sensor and a spectrum of reflected light from the workpiece transmitted from the transparent-window sensor.
Figure 4:
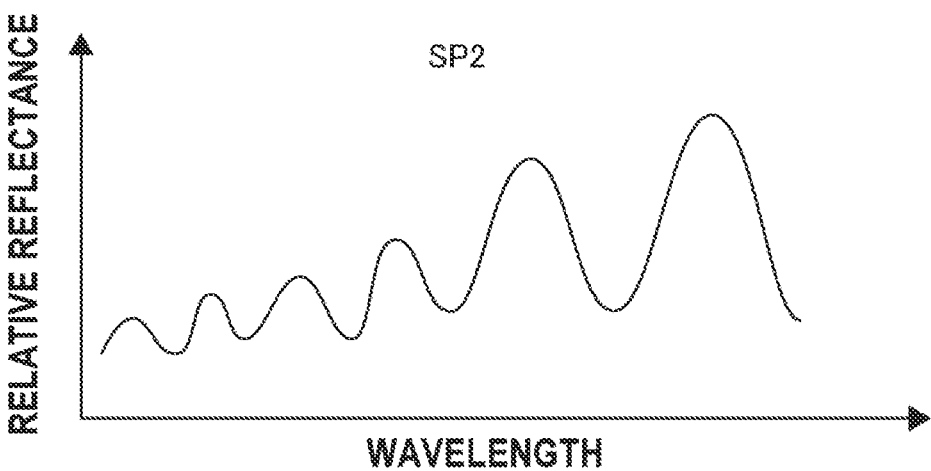

FIG. 4 is a diagram showing a spectrum SP1 of the reflected light from the workpiece W transmitted from the liquid-seal sensor 25 and a spectrum SP2 of the reflected light from the workpiece W transmitted from the transparent-window sensor 31. The spectrum SP1 and the spectrum SP2 are created based on the intensity measurement data generated by the same spectrometer 40. Therefore, the spectrum SP1 and the spectrum SP2 have the same wavelength range, but have different amplitudes.

Figure 5:
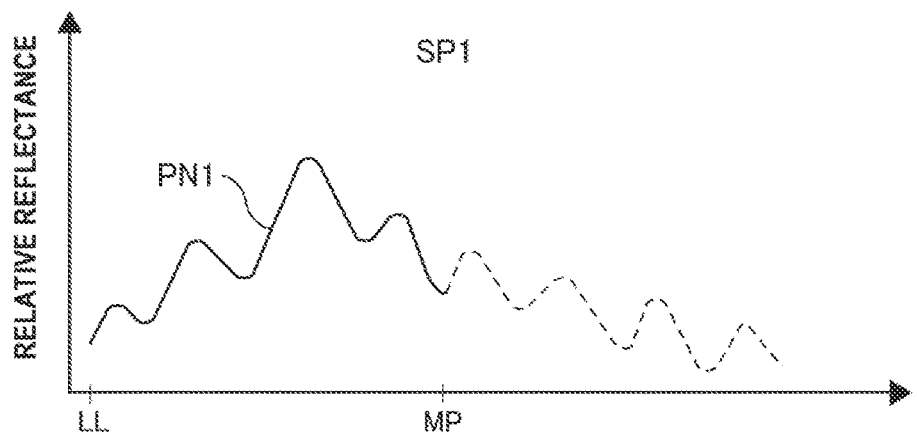
FIG. 5 is a diagram illustrating producing a composite spectrum.
Figure 5:
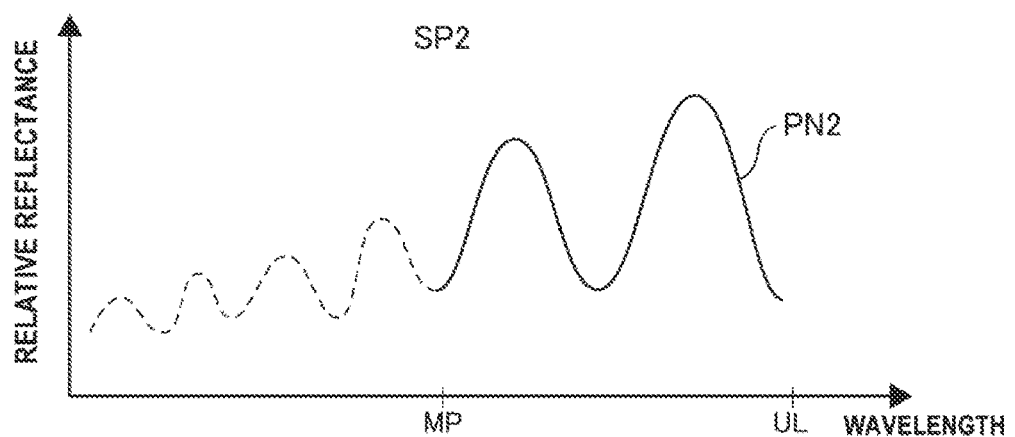
Figure 5:
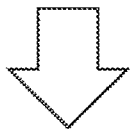
Figure 5:
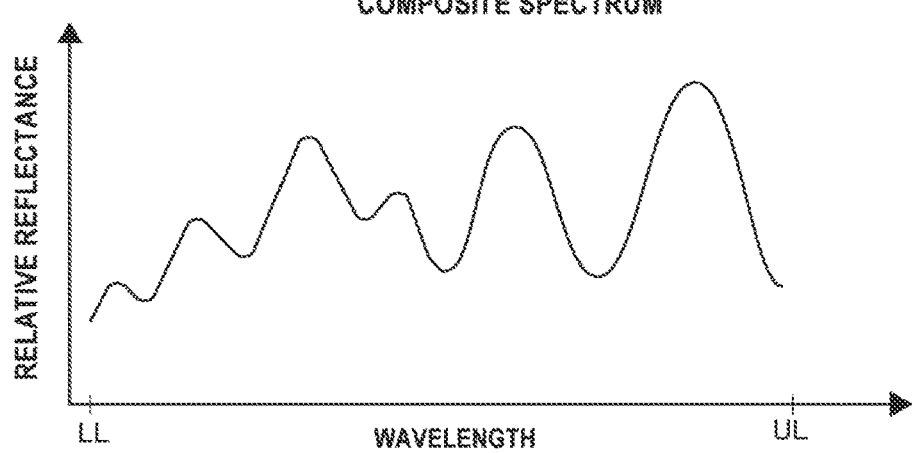

FIG. 5 is a diagram of an embodiment illustrating producing the composite spectrum by combining the spectrum SP1 of the reflected light from the workpiece W transmitted from the liquid-seal sensor 25 and the spectrum SP2 of the reflected light from the workpiece W transmitted from the transparent-window sensor 31. The spectrum processing device 45 joins a portion PN1 of the spectrum SP1 ranging from a first wavelength (e.g., a lower limit wavelength) LL to a predetermined intermediate wavelength MP and a portion PN2 of the spectrum SP2 ranging from the predetermined intermediate wavelength MP to a second wavelength (e.g., an upper limit wavelength) UL, thereby producing the composite spectrum. In order to smoothly combine the spectrum SP1 and the spectrum SP2, the spectrum processing device 45 may enlarge, shrink, or move one or both of the spectrum SP1 and the spectrum SP2 along light intensity (along relative reflectance).

The composite spectrum includes intensities of the reflected light reflecting the film thickness of the workpiece W in a wide wavelength range from the first wavelength (e.g., a lower limit wavelength) LL to the second wavelength (e.g., an upper limit wavelength) UL. Therefore, the spectrum processing device 45 can accurately determine the film thickness of the workpiece W based on the composite spectrum. In particular, the spectrum processing device 45 can accurately determine the thickness of various types of films.

Figure 6:
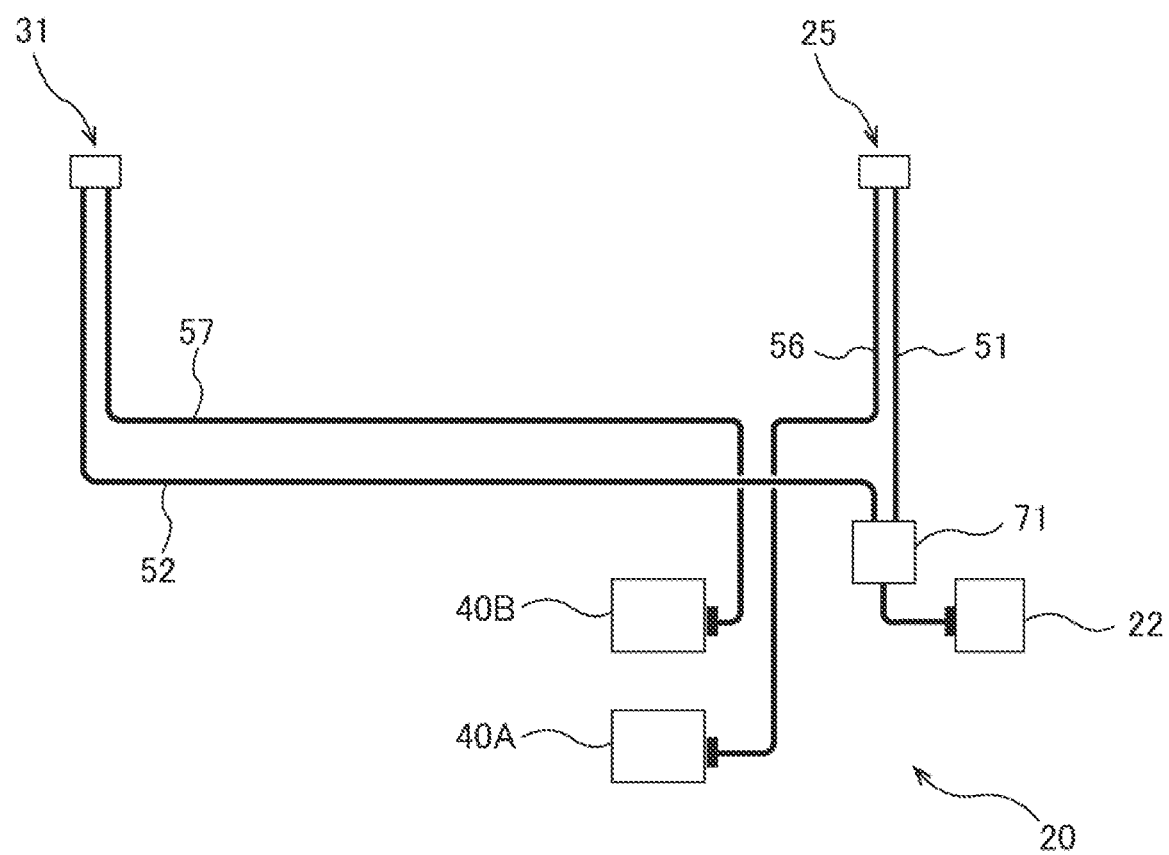
FIG. 6 is a schematic diagram showing another embodiment of a film-thickness measuring apparatus.

FIG. 6 is a schematic diagram showing another embodiment of the film-thickness measuring apparatus 20. Configurations and operations of this embodiment, which will not be particularly described, are the same as those of the embodiments described with reference to FIGS. 1 to 5, and duplicated descriptions will be omitted. In the embodiment shown in FIG. 6, the film-thickness measuring apparatus 20 includes a first spectrometer 40A and a second spectrometer 40B coupled to the liquid-seal sensor 25 and the transparent-window sensor 31, respectively. The second optical-path switching device 72 is not provided. The first spectrometer 40A is coupled to the liquid-seal sensor 25 via the first light-receiving optical fiber cable 56, and the second spectrometer 40B is coupled to the transparent window-type sensor 31 via the second light-receiving optical fiber cable 57.

The first spectrometer 40A and the second spectrometer 40B are configured to measure intensities of the reflected light from the workpiece W in different wavelength ranges. More specifically, the first spectrometer 40A is configured to measure intensities of the reflected light in a first wavelength range to generate first intensity measurement data, and the second spectrometer 40B is configured to measure intensities of the reflected light in a second wavelength range to generate second intensity measurement data. The first wavelength range is different from the second wavelength range.

Figure 7:
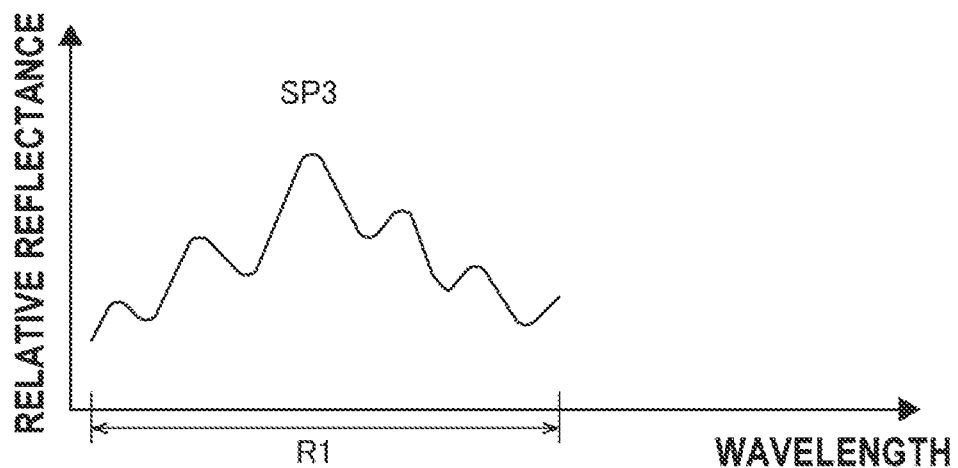
FIG. 7 is a diagram showing a spectrum created from first intensity measurement data generated by a first spectrometer and a spectrum created from second intensity measurement data generated by a second spectrometer.
Figure 7:
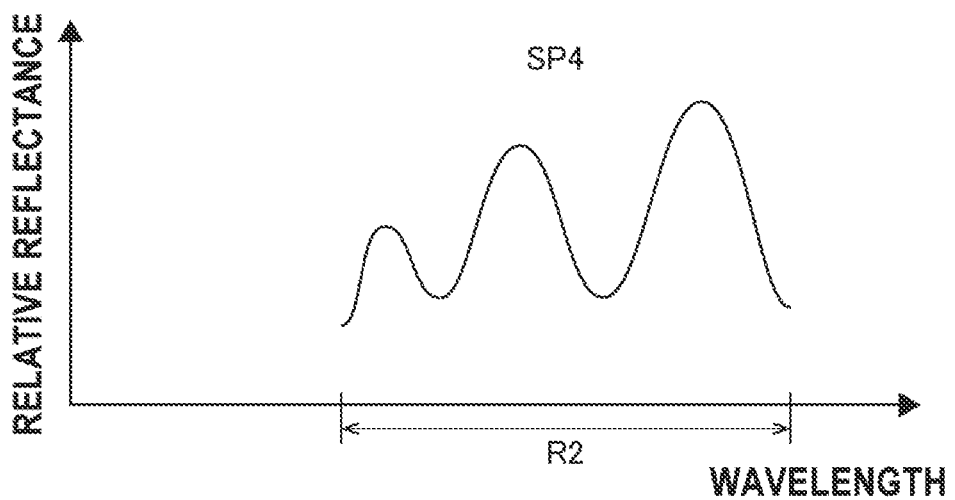

FIG. 7 is a diagram showing a spectrum SP3 created from the first intensity measurement data generated by the first spectrometer 40A and a spectrum SP4 created from the second intensity measurement data generated by the second spectrometer 40B. The spectrum processing device 45 produces the spectrum SP3 from the first intensity measurement data and determines the film thickness of the workpiece W based on the spectrum SP3. Similarly, the spectrum processing device 45 produces the spectrum SP4 from the second intensity measurement data and determines the film thickness of the workpiece W based on the spectrum SP4.

As can be seen in FIG. 7, a first wavelength range R1 of the spectrum SP3 is different from a second wavelength range R2 of the spectrum SP4, while the first wavelength range R1 and the second wavelength range R2 partially overlap. In one example, the first wavelength range R1 is from 200 nm to 1100 nm, and the second wavelength range R2 is from 900 nm to 1700 nm.

The spectrum SP3 having the first wavelength range R1 at a shorter-wavelength side is a spectrum of the reflected light transmitted from the liquid-seal sensor 25. A wavelength band of light absorbed by water is not included in the first wavelength range R1 of the spectrum SP3. Therefore, the spectrum processing device 45 can accurately determine the film thickness of the workpiece W from the spectrum SP3.

The spectrum SP4 having the second wavelength range R2 at a longer-wavelength side is a spectrum of the reflected light transmitted from the transparent-window sensor 31. A wavelength band of light that is hard to pass through the transparent window 33 is not included in the second wavelength range R2 of the spectrum SP4. Therefore, the spectrum processing device 45 can accurately determine the film thickness of the workpiece W from the spectrum SP4.

In one embodiment, as described with reference to FIG. 5, the spectrum processing device 45 may be configured to produce a composite spectrum by combining the spectrum SP3 of the reflected light from the workpiece W transmitted from the liquid-seal sensor 25 and the spectrum SP4 of the reflected light from the transparent-window sensor 31, and determine the film thickness of the workpiece W based on the composite spectrum.

Figure 8:
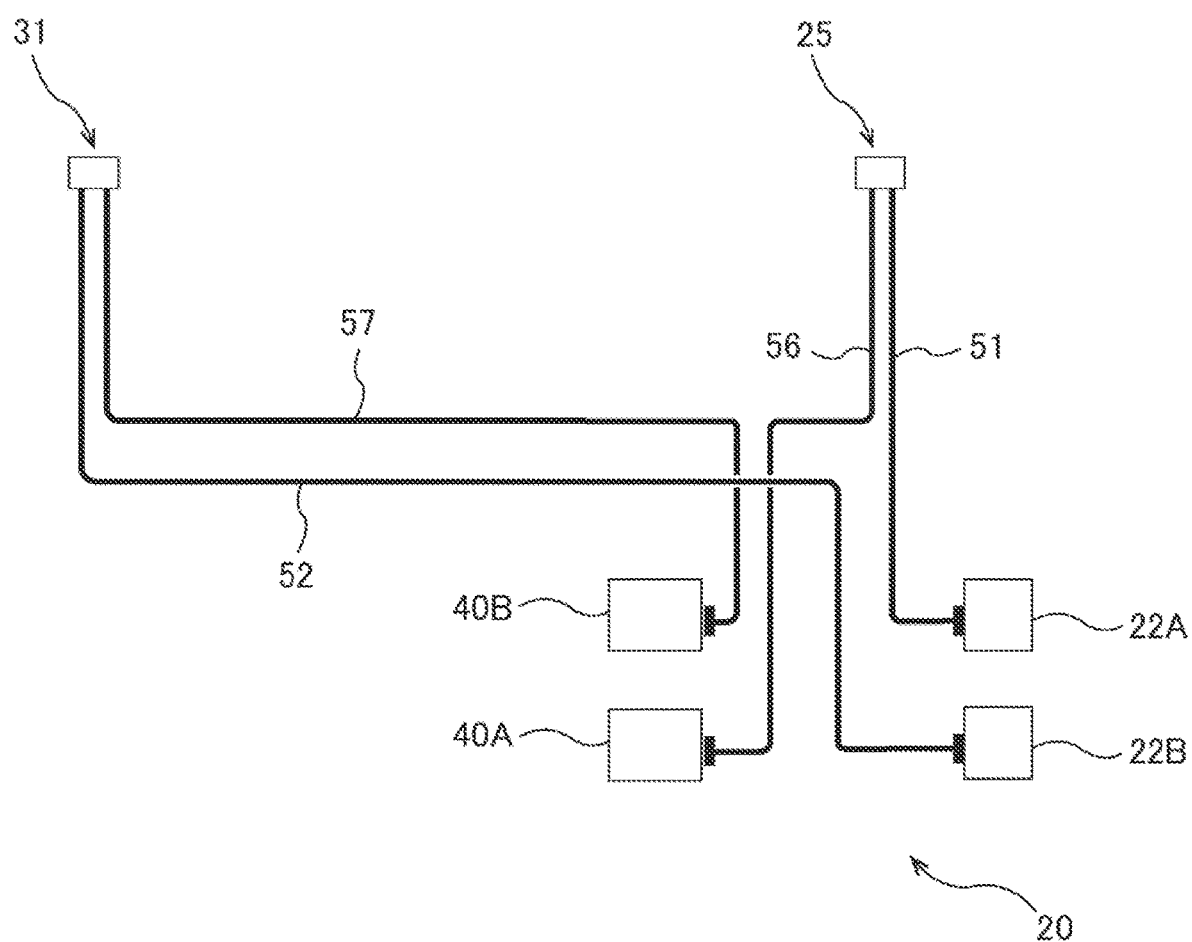
FIG. 8 is a schematic diagram showing still another embodiment of the film-thickness measuring apparatus.

In one embodiment, as shown in FIG. 8, the film-thickness measuring apparatus 20 may include a first light source 22A and a second light source 22B coupled to the liquid-seal sensor 25 and the transparent-window sensor 31, respectively. The first optical-path switching device 71 is not provided. The first light source 22A is coupled to the liquid-seal sensor 25 via the first light-emitting optical fiber cable 51, and the second light source 22B is coupled to the transparent window-type sensor 31 via the second light-emitting optical fiber cable 52. Other configurations and operations of this embodiment, which will not be particularly described, are the same as those of the embodiment described with reference to FIG. 6, and duplicated descriptions will be omitted.

Figure 9:
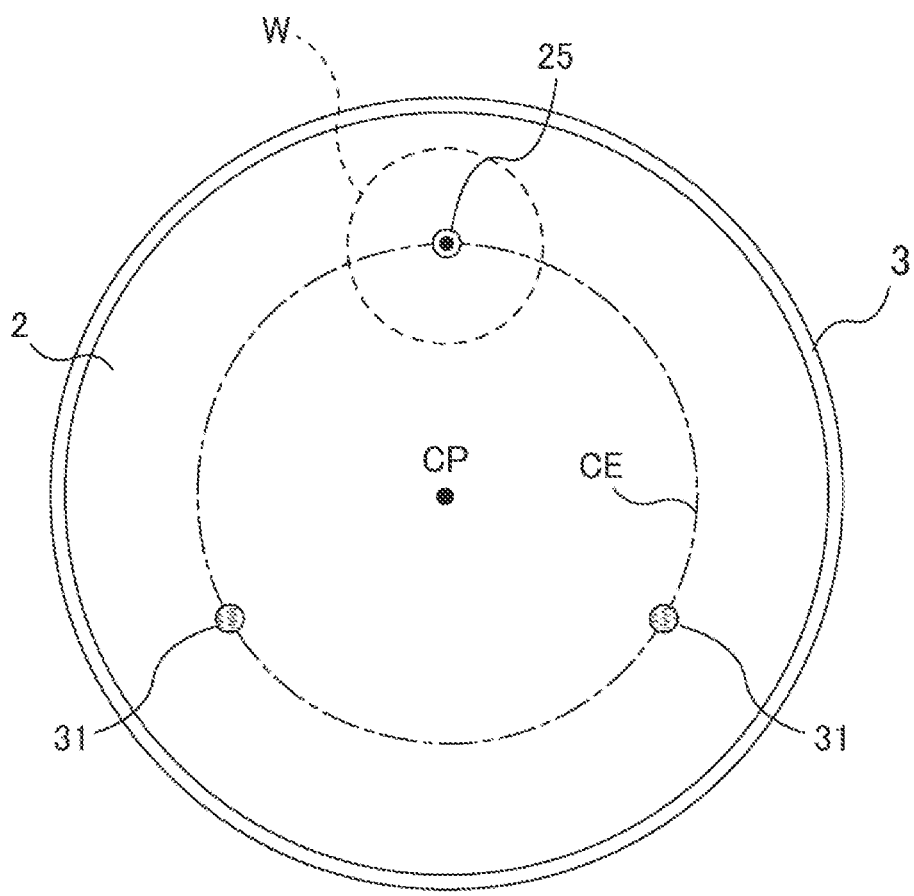
FIG. 9 is a plan view showing an embodiment of the film-thickness measuring apparatus including one liquid-seal sensor and two transparent-window sensors.
Figure 10:
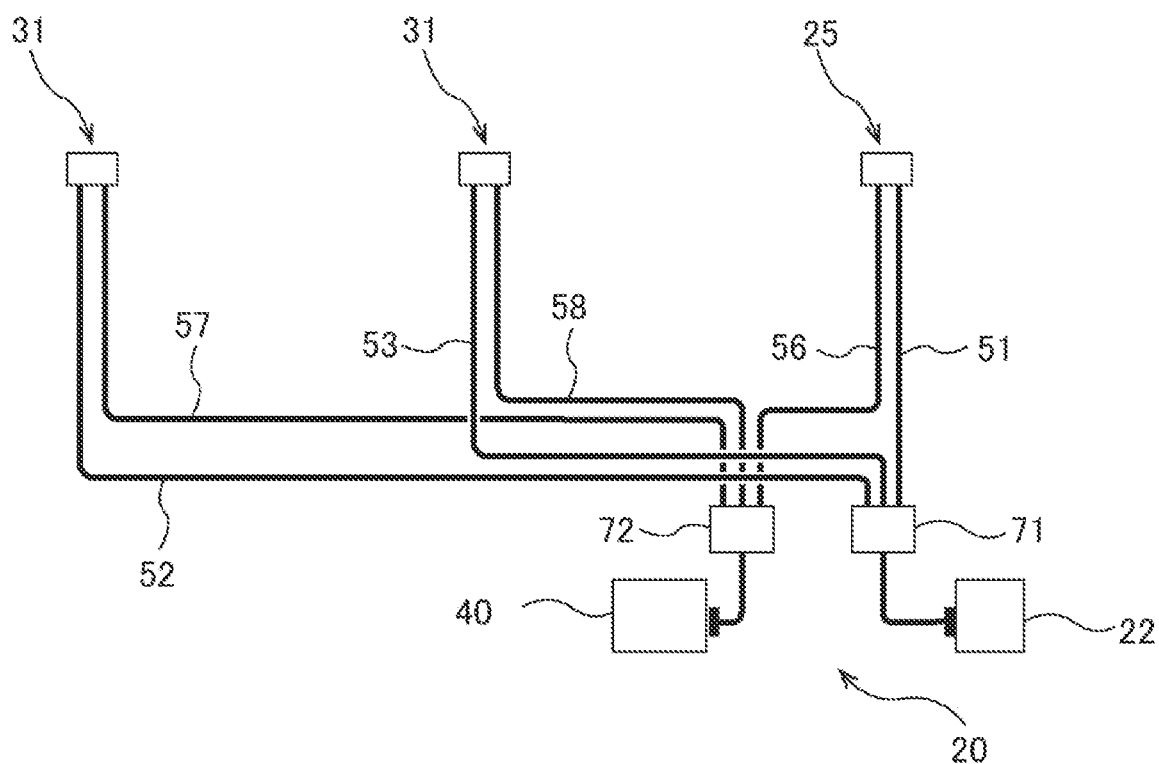
FIG. 10 is a schematic diagram showing an embodiment of the film-thickness measuring apparatus including one liquid-seal sensor and two transparent-window sensors.

The number and an arrangement of liquid-seal sensor 25 and transparent-window sensor 31 are not limited to those of the embodiments described above. In one embodiment, as shown in FIGS. 9 and 10, the film-thickness measuring apparatus 20 may include one liquid-seal sensor 25 and two transparent-window sensors 31. In the embodiment shown in FIGS. 9 and 10, the liquid-seal sensor 25 is coupled to common light source 22 by the first light-emitting optical fiber cable 51 via the first optical-path switching device 71, and is further coupled to common spectrometer 40 by the first light-receiving optical fiber cable 56 via the second optical-path switching device 72. The two transparent-window sensors 31 are coupled to the common light source 22 by the second light-emitting optical fiber cable 52 and a third light-emitting optical fiber cable 53 via the first optical-path switching device 71, and is further coupled to the common spectrometer 40 by the second light-receiving optical fiber cable 57 and a third light-receiving optical fiber cable 58 via the second optical-path switching device 72.

The first optical-path switching device 71 and the second optical-path switching device 72 operate each time the polishing table 3 makes one rotation, and optically couple the light source 22 and the spectrometer 40 to one of the liquid-seal sensor 25 and the two transparent-window sensors 31. More specifically, when the liquid-seal sensor 25 is located under the workpiece W retained by the polishing head 1, the first optical-path switching device 71 and the second optical-path switching device 72 couple the light source 22 and the spectrometer 40 to the liquid-seal sensor 25. When one of the two transparent-window sensors 31 is located under the workpiece W retained by the polishing head 1, the first optical-path switching device 71 and the second optical-path switching device 72 couple the light source 22 and the spectrometer 40 to the one transparent-window sensor 31. When the other transparent-window sensor 31 is located under the workpiece W retained by the polishing head 1, the first optical-path switching device 71 and the second optical-path switching device 72 couple the light source 22 and the spectrometer 40 to the other transparent-window sensor 31.

In this embodiment also, as described with reference to FIG. 5, the spectrum processing device 45 may be configured to produce a composite spectrum by combining the spectrum of the reflected light from the workpiece W transmitted from the liquid-seal sensor 25 and the spectrum of the reflected light from the workpiece W transmitted from the two transparent-window sensors 31, and determine the film thickness of the workpiece W based on the composite spectrum. More specifically, the spectrum processing device 45 produces an average spectrum of the reflected light spectra transmitted from the two transparent-window sensors 31, produces a composite spectrum by combining the spectrum transmitted from the liquid-seal sensor 25 and the average spectrum, and determine the film thickness of the workpiece W based on the composite spectrum.

Figure 11:
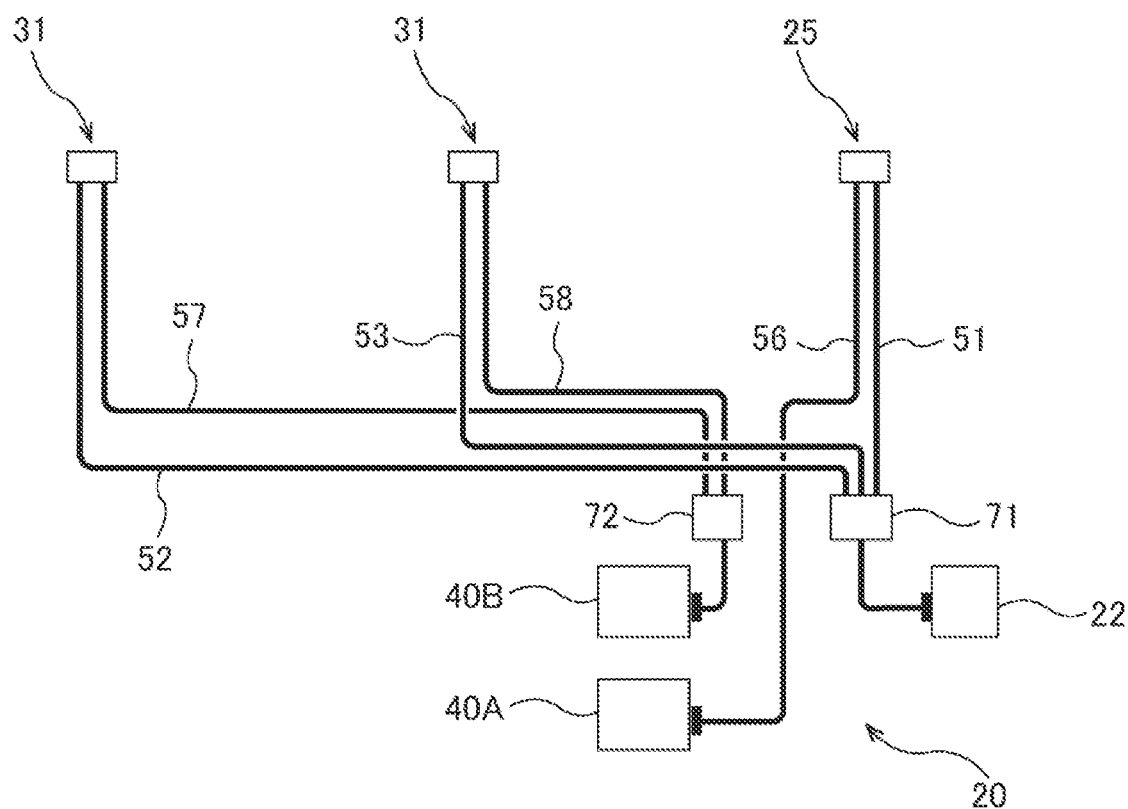
FIG. 11 is a schematic diagram showing still another embodiment of the film-thickness measuring apparatus.
Figure 12:
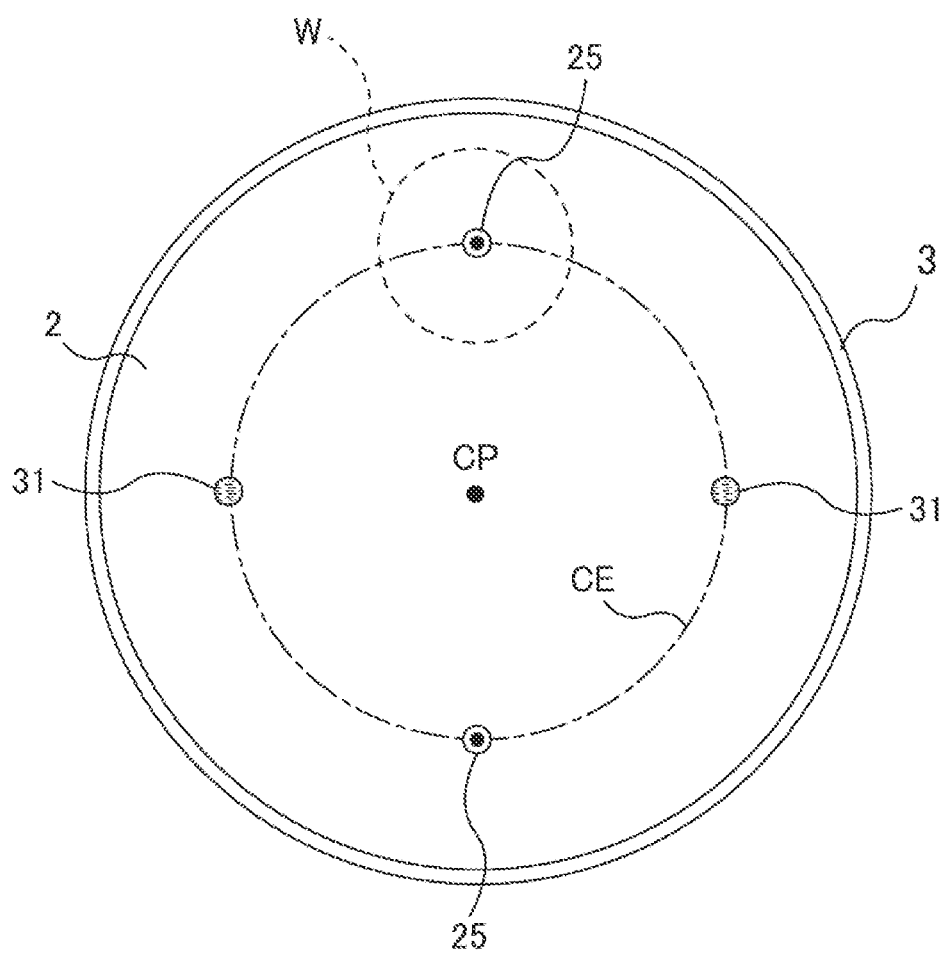
FIG. 12 is a schematic diagram showing an embodiment of the film-thickness measuring apparatus having a plurality of liquid-seal sensors and a plurality of transparent-window sensors arranged on the same circumference.
Figure 13:
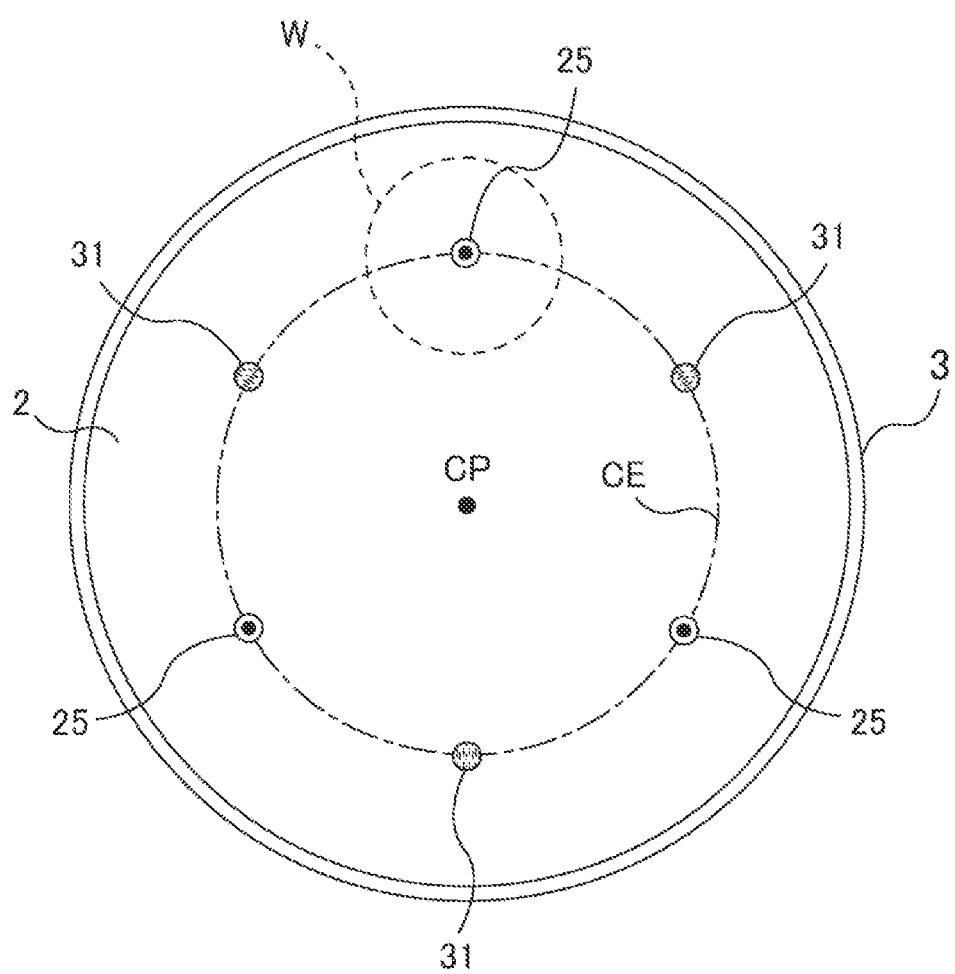
FIG. 13 is a schematic diagram showing an embodiment of the film-thickness measuring apparatus having a plurality of liquid-seal sensors and a plurality of transparent-window sensors arranged on the same circumference.

In one embodiment, as shown in FIG. 11, the film-thickness measuring apparatus 20 may include first spectrometer 40A coupled to the liquid-seal sensor 25 by the first light-receiving optical fiber cable 56, and second spectrometer 40B coupled to the two transparent-window sensors 31 by the second light-receiving optical fiber cable 57 and the third light-receiving optical fiber cable 58. The two transparent-window sensors 31 are coupled to the second spectrometer 40B via the second optical-path switching device 72, and the liquid-seal sensor 25 is coupled to the first spectrometer 40A without the second optical-path switching device 72. Configurations and operations of the first spectrometer 40A and the second spectrometer 40B are the same as those of the embodiment with reference to FIGS. 6 and 7, and duplicated descriptions will be omitted.

As shown in FIGS. 12 to 15, the film-thickness measuring apparatus 20 may include a plurality of liquid-seal sensors 25 and a plurality of transparent-window sensors 31. In the embodiments shown in FIGS. 12 and 13, the plurality of liquid-seal sensors 25 and the plurality of transparent-window sensors 31 are arranged on the same circumference CE.

Figure 14:
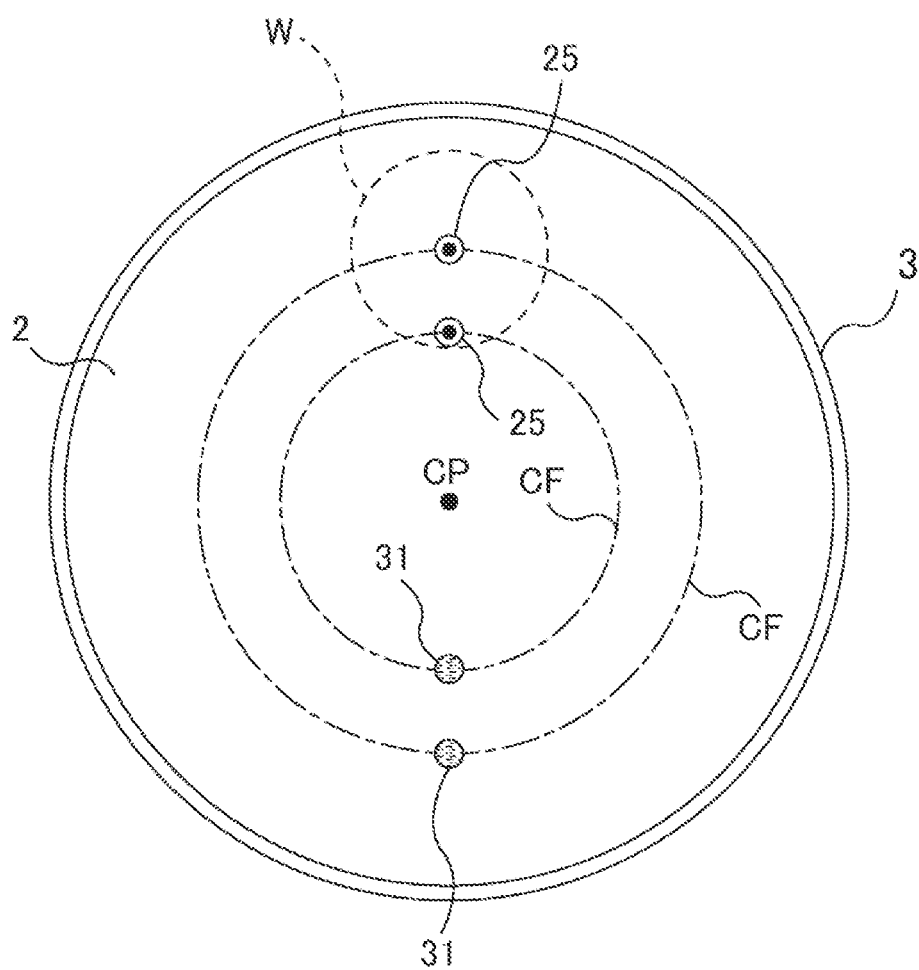
FIG. 14 is a schematic diagram showing an embodiment of the film-thickness measuring apparatus having a plurality of liquid-seal sensors and a plurality of transparent-window sensors arranged on concentric circles.
Figure 15:
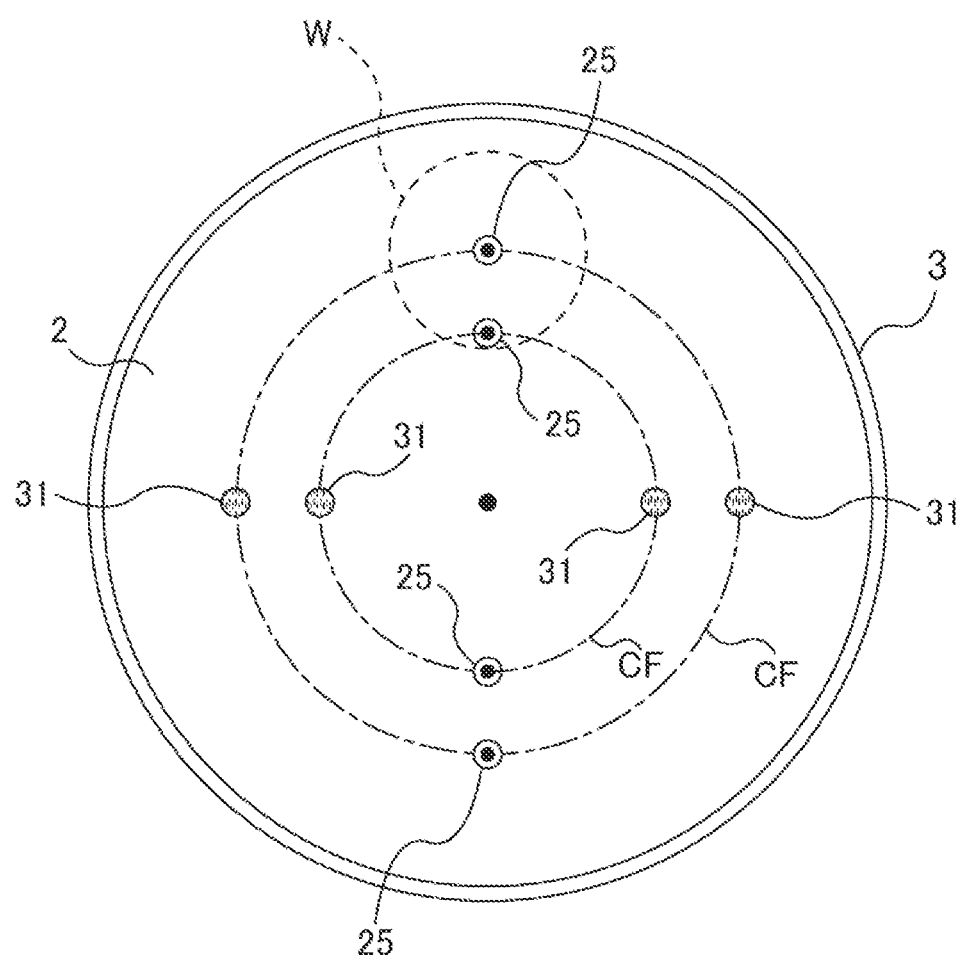
FIG. 15 is a schematic diagram showing an embodiment of the film-thickness measuring apparatus having a plurality of liquid-seal sensors and a plurality of transparent-window sensors arranged on concentric circles.

In the embodiment shown in FIG. 14, the liquid-seal sensor 25 and the transparent-window sensor 31 are arranged on each of a plurality of concentric circles CF having the same center as the rotation center CP of the polishing table 3. The plurality of concentric circles CF represent movement paths of the liquid-seal sensors 25 and the transparent-window sensors 31. One of the plurality of concentric circles CF extends through the center of the workpiece W retained by the polishing head 1, and the other one of the plurality of concentric circles CF extends through an edge portion of the workpiece W retained by the polishing head 1. As shown in FIG. 15, a plurality of liquid-seal sensors 25 and a plurality of transparent-window sensors 31 may be arranged on each of the plurality of concentric circles CF. In the embodiment shown in FIG. 14, two concentric circles CF are set, while three or more concentric circles may be set.

The number and the arrangement of liquid seal type sensor(s) 25 and transparent-window sensor(s) 31 are not limited to the illustrated embodiments, and various numbers and arrangements may be applied.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A film-thickness measuring method comprising:
   pressing a workpiece against a polishing pad, while rotating a polishing table that supports the polishing pad, to polish the workpiece;
   during polishing of the workpiece, directing light to the workpiece from a liquid-seal sensor and a transparent-window sensor disposed in the polishing table and receiving reflected light from the workpiece by the liquid-seal sensor and the transparent-window sensor; and
   producing a composite spectrum by extracting a first sub-part from a first spectrum of reflected light from the workpiece transmitted from the liquid-seal sensor, extracting a second sub-part from a second spectrum of reflected light from the workpiece transmitted from the transparent-window sensor, and connecting the first sub-part to the second sub-part to form the composite spectrum, the first sub-part being in a first wavelength range, and the second sub-part being in a second wavelength range different from the first wavelength range;
   determining a film thickness of the workpiece based on the composite spectrum,
   wherein the liquid-seal sensor has a liquid flow passage through which liquid flows, and a first optical sensor head disposed in the liquid flow passage, and
   the transparent-window sensor has a second optical sensor head, and a transparent window arranged above the second optical sensor head.

2. The film-thickness measuring method according to claim 1, wherein the liquid-seal sensor and the transparent-window sensor are arranged on a circumference having the same center as a rotation center of the polishing table.

3. The film-thickness measuring method according to claim 1, wherein
   a film thickness of the workpiece is determined in a first polishing period based on a spectrum of the reflected light from the workpiece transmitted from one of the liquid-seal sensor and the transparent-window sensor, and
   a film thickness of the workpiece is determined in a second polishing period based on a spectrum of the reflected light from the workpiece transmitted from other of the liquid-seal sensor and the transparent-window sensor.

4. The film-thickness measuring method according to claim 3, wherein the first polishing period includes a polishing initial point, and the second polishing period includes a polishing end point.

5. The film-thickness measuring method according to claim 1, wherein the liquid-seal sensor and the transparent-window sensor comprise a plurality of liquid-seal sensors and a plurality of transparent-window sensors.

6. The film-thickness measuring method according to claim 1, wherein the liquid-seal sensor and the transparent-window sensor are arranged on each of a plurality of concentric circles having the same center as a rotation center of the polishing table.

7. The film-thickness measuring method according to claim 1, wherein the first wavelength range is a range from a first wavelength to an intermediate wavelength, and the second wavelength range is a range from the intermediate wavelength to a second wavelength.

8. A film-thickness measuring apparatus comprising:
a liquid-seal sensor and a transparent-window sensor disposed in a rotatable polishing table configured to support a polishing pad for polishing a workpiece, each of the liquid-seal sensor and the transparent-window sensor being configured to direct light to a workpiece on the polishing pad and receive reflected light from the workpiece; and
a spectrum processing device configured to produce a composite spectrum by combining extracting a first sub-part from a first spectrum of reflected light from the workpiece transmitted from the liquid-seal sensor, and extracting a second sub-part from a second spectrum of reflected light from the workpiece transmitted from the transparent-window sensor, and connecting the first sub-part to the second sub-part to form the composite spectrum, and determine a film thickness of the workpiece based on the composite spectrum, the first sub-part spectrum being in a first wavelength range, and the second sub-part spectrum being in a second wavelength range different from the first wavelength range,
wherein the liquid-seal sensor has a liquid flow passage configured to pass liquid therethrough, and a first optical sensor head disposed in the liquid flow passage, and
the transparent-window sensor has a second optical sensor head, and a transparent window arranged above the second optical sensor head.

9. The film-thickness measuring apparatus according to claim 8,
wherein the liquid-seal sensor and the transparent-window sensor are arranged on a circumference having the same center as a rotation center of the polishing table.

10. The film-thickness measuring apparatus according to claim 8, wherein
the spectrum processing device is configured to:
determine a film thickness of the workpiece in a first polishing period based on a spectrum of the reflected light from the workpiece transmitted from one of the liquid-seal sensor and the transparent-window sensor; and
determine a film thickness of the workpiece in a second polishing period based on a spectrum of the reflected light from the workpiece transmitted from other of the liquid-seal sensor and the transparent-window sensor.

11. The film-thickness measuring apparatus according to claim 10, wherein the first polishing period includes a polishing initial point, and the second polishing period includes a polishing end point.

12. The film-thickness measuring apparatus according to claim 8, wherein the liquid-seal sensor and the transparent-window sensor comprise a plurality of liquid-seal sensors and a plurality of transparent-window sensors.

13. The film-thickness measuring apparatus according to claim 8, wherein the liquid-seal sensor and the transparent-window sensor are arranged on each of a plurality of concentric circles having the same center as a rotation center of the polishing table.

14. The film-thickness measuring apparatus according to claim 8, wherein the first wavelength range is a range from a first wavelength to an intermediate wavelength, and the second wavelength range is a range from the intermediate wavelength to a second wavelength.

* * * * *